(12) United States Patent
Ton et al.

(10) Patent No.: US 12,238,856 B2
(45) Date of Patent: Feb. 25, 2025

(54) HEAT SINK WITH ADAPTIVE CURVATURE TO MITIGATE THERMAL RUNAWAY FOR A CIRCUIT COMPONENT

(71) Applicant: Cisco Technology, Inc., San Jose, CA (US)

(72) Inventors: Paul Ton, San Jose, CA (US); Yaotsan Tsai, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 48 days.

(21) Appl. No.: 17/503,000

(22) Filed: Oct. 15, 2021

(65) Prior Publication Data

US 2023/0118952 A1  Apr. 20, 2023

(51) Int. Cl.
| | | |
|---|---|---|
| H05K 1/02 | (2006.01) | |
| H01L 23/473 | (2006.01) | |
| H05K 7/20 | (2006.01) | |

(52) U.S. Cl.
CPC ....... H05K 1/0272 (2013.01); H05K 7/20254 (2013.01); *H01L 23/473* (2013.01)

(58) Field of Classification Search
CPC ... H01L 23/473; H01L 23/467; H01L 23/367; H05K 1/0272; H05K 1/0203; H05K 7/20; H05K 7/20254; H05K 1/189
See application file for complete search history.

(56) References Cited

U.S. PATENT DOCUMENTS

| | | | | |
|---|---|---|---|---|
| 4,072,188 A | * | 2/1978 | Wilson | F28F 3/12 165/83 |
| 4,854,377 A | * | 8/1989 | Komoto | H01L 23/433 257/E23.09 |
| 5,172,755 A | * | 12/1992 | Samarov | H01L 23/4006 165/185 |
| 5,323,292 A | * | 6/1994 | Brzezinski | H01L 23/433 361/689 |
| 7,019,976 B1 | * | 3/2006 | Ahmad | H01L 23/433 257/E23.09 |
| 7,760,507 B2 | * | 7/2010 | Jewram | H01L 24/29 174/548 |
| 2002/0185718 A1 | * | 12/2002 | Mikubo | H05K 1/0207 257/E23.09 |
| 2002/0195229 A1 | * | 12/2002 | Hsieh | F28F 3/04 257/722 |
| 2004/0074630 A1 | * | 4/2004 | Sen | H01L 23/473 257/E23.09 |
| 2004/0149423 A1 | | 8/2004 | Johnson et al. | |
| 2004/0206478 A1 | | 10/2004 | Delano et al. | |
| 2005/0199371 A1 | * | 9/2005 | Kemink | H01L 23/3672 165/80.3 |

(Continued)

*Primary Examiner* — Adam B Dravininkas
(74) *Attorney, Agent, or Firm* — Edell, Shapiro & Finnan, LLC (57) ABSTRACT

A heat sink component includes a cold plate including a first surface configured to engage a circuit component and a second surface opposing the first surface, and a plurality of fins extending transversely from the second surface of the cold plate. The first surface includes a non-planar surface portion and a planar surface portion surrounding the non-planar surface portion. The non-planar surface portion of the cold plate provides an adaptive contour to complement a surface of a circuit component that experiences thermal warpage due to change in temperature during operation.

20 Claims, 11 Drawing Sheets

(56) References Cited

U.S. PATENT DOCUMENTS

| | | | |
|---|---|---|---|
| 2007/0040267 A1* | 2/2007 | Zhao | H01L 23/24 |
| | | | 257/E23.101 |
| 2007/0147002 A1* | 6/2007 | Otsuki | H01L 23/467 |
| | | | 257/E23.099 |
| 2007/0159799 A1* | 7/2007 | Dando, III | H01L 23/373 |
| | | | 257/E23.09 |
| 2008/0073070 A1 | 3/2008 | Kuo | |
| 2012/0006514 A1* | 1/2012 | Bratkovski | H01L 23/367 |
| | | | 165/185 |
| 2013/0148314 A1* | 6/2013 | Hirai | H01L 25/165 |
| | | | 361/748 |
| 2014/0224467 A1* | 8/2014 | Yokota | F28F 21/08 |
| | | | 165/185 |
| 2016/0252312 A1 | 9/2016 | Tessnow | |

* cited by examiner

HEAT SINK WITH ADAPTIVE CURVATURE TO MITIGATE THERMAL RUNAWAY FOR A CIRCUIT COMPONENT

TECHNICAL FIELD

The present disclosure relates to thermal management of integrated circuit components, such as an ASIC, during operations.

BACKGROUND

Package sizes for circuit components, such as integrated circuit (e.g., ASIC) components, are steadily increasing in size and complexity in computing functions due to faster processing speeds and communications required for electronic devices. It is very important to manage heat transfer from such circuit components with effective heat sink systems in contact with the components. The surface warpage (lid or die) of a circuit component such as an ASIC (application specific integrated circuit) changes as a function of temperature due to a coefficient of thermal expansion (CTE) mismatch between various materials used to form the circuit package. For example, during normal operations, temperatures of the circuit package can change in a range from about 30° C. to about 90° C. or greater depending upon a particular package configuration. The warpage of the circuit package at a surface location in contact with a heat sink can change over this change in temperature, leading to a decrease in surface contact (i.e., creating a gap) and a corresponding decrease in thermal transfer effectiveness (negatively impacting thermal cooling performance) between the circuit component and the heat sink. This can also lead to thermal runaway issues associated with the circuit component.

While thermal pads (including hybrid thermal pads, which can include a phase change material) can be used to reduce gaps caused by change in surface warpage, the thermal pads also can have high thermal resistance which can generate a bottleneck in thermal cooling.

Thus, an effective heat sink that is capable of maintaining adequate cooling of a circuit component during changes in contact surface warpage is desired.

DESCRIPTION OF EXAMPLE EMBODIMENTS

Overview

In an embodiment, a heat sink component comprises a cold plate including a first surface configured to engage a circuit component and a second surface opposing the first surface, and a plurality of fins extending transversely from the second surface of the cold plate. The first surface includes a non-planar surface portion and a planar surface portion surrounding the non-planar surface portion. The non-planar surface portion of the cold plate provides an adaptive contour to complement a surface of a circuit component that experiences thermal warpage due to change in temperature during operation.

In another embodiment, an apparatus comprises a printed circuit board (PCB), a circuit component coupled with the PCB, and a heat sink component coupled with the circuit component. The heat sink component comprises a cold plate including a first surface configured to engage a surface of the circuit component and a second surface opposing the first surface, and a plurality of fins extending transversely from the second surface of the cold plate, where the first surface includes a non-planar surface portion and a planar surface portion surrounding the non-planar surface portion.

In a further embodiment, a method comprises providing a cold plate for a heat sink including a first surface configured to engage a circuit component and a second surface opposing the first surface, contouring the first surface to include a non-planar surface portion and a planar surface portion surrounding the non-planar surface portion, and providing a plurality of fins extending transversely from the second surface of the cold plate.

EXAMPLE EMBODIMENTS

Described herein is an apparatus or cooling system for a circuit component that comprises a heat sink component including a base or cold plate and cooling fins extending transversely from the cold plate. The cold plate includes a convex curvature along its lower or component engaging side that has been adapted to precisely conform with a warpage that develops along the upper or engaging side of the circuit component during operations with increasing temperatures of the circuit component.

The circuit component can comprise any type of integrated circuit component, such as an Application Specific Integrated Circuit (ASIC), where the circuit component is coupled or integrated with a printed circuit board (PCB) (e.g., in a die package) within the housing of an electronic device. While an ASIC component is described as the circuit component in example embodiments (e.g., as shown in the drawings), the cooling system with heat sink component can be implemented with any other type of circuit component including, without limitation, a processor and/or any other circuit component associated with a central processing unit (CPU) component, a graphics processing unit (GPU), a neural processing unit (NPU), etc. The PCB including a heat sink component coupled with a circuit component as described herein can be implemented for use in any type of computing or other electronic device including, without limitation, networking devices such as routers, switches, hubs, access points, etc.

Figure 1A:
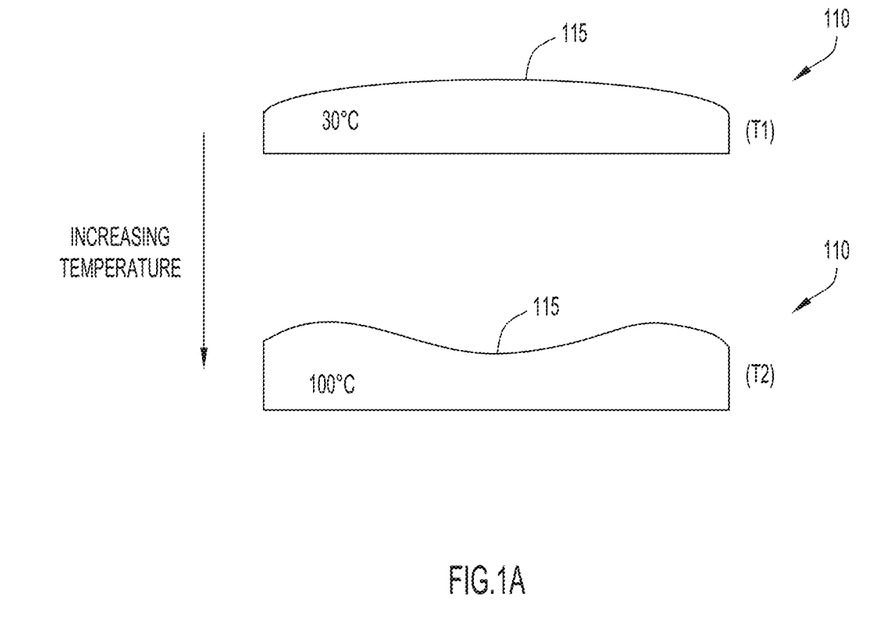
FIG. 1A depicts side views in cross-section of a circuit component (e.g., ASIC component) that undergoes a change in warpage along its surface in response to a temperature change.
Figure 1B:
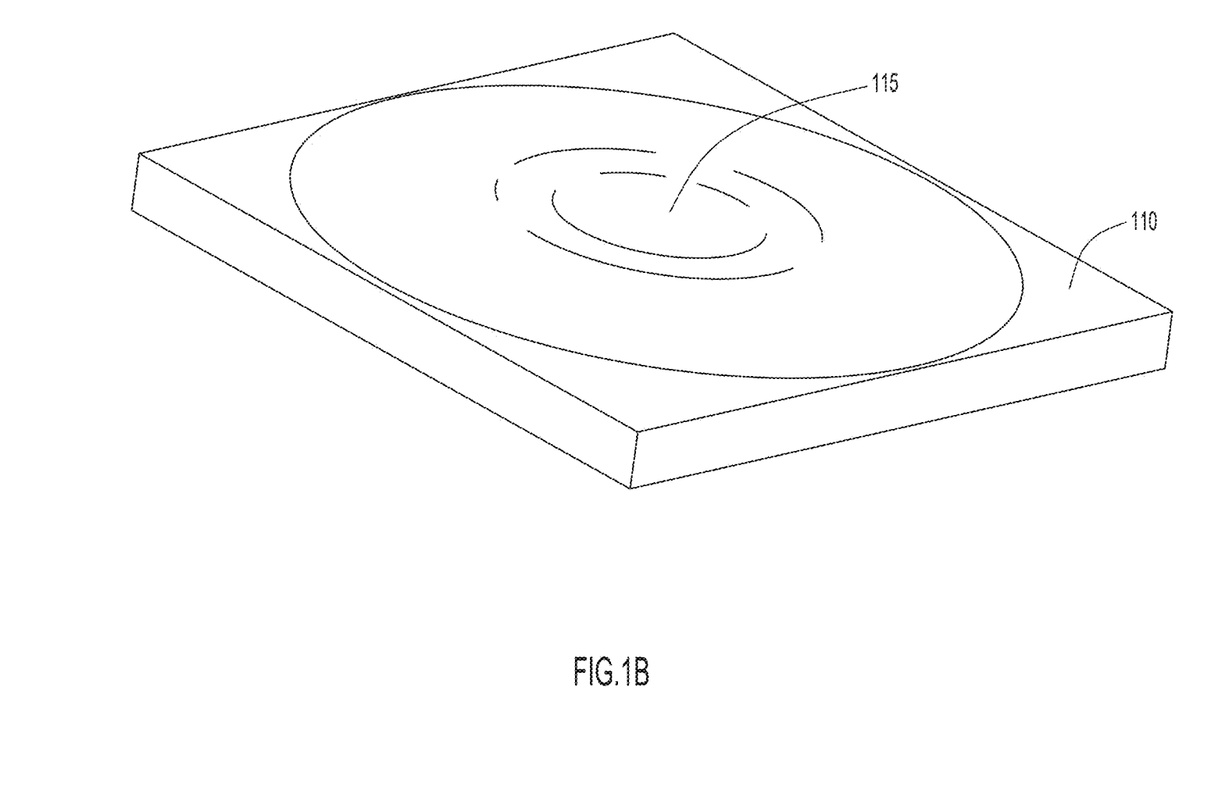
FIG. 1B depicts an upper side view in perspective of the circuit component of FIG. 1A
Figure 1C:
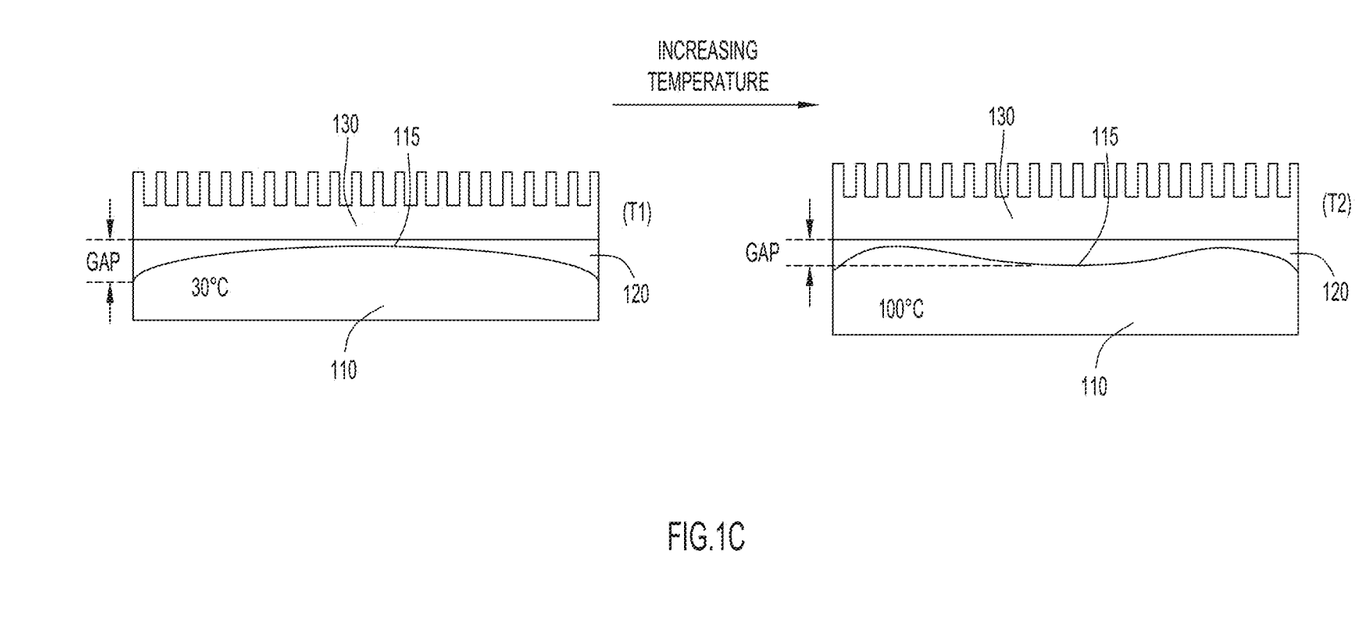
FIG. 1C depicts the same side views in cross-section of the circuit component of FIG. 1A and further including a conventional heat sink component adjacent the surface of the circuit component that demonstrates how change in warpage of the circuit component surface caused by temperature change introduces a gap therebetween.

Referring to the example embodiments depicted in FIGS. 1A, 1B and 1C, a circuit component 110 is generally depicted (alone in FIGS. 1A and 1B and with a conventional heat sink structure as shown in FIG. 1C). As previously noted, the circuit component can comprise an ASIC, e.g., provided as a die package. The top or heat sink facing surface 115 of the component 110 (which can be the component top surface or an outer surface of a package cover or lid) is generally planar but includes a slight convex curvature at or approaching a central surface area location of the surface 115. The curvature of the component top surface is somewhat exaggerated in the figures in order to clearly demonstrate the temperature warpage effect and other features of the embodiments described herein. At lower (e.g., ambient) temperatures T1 (e.g., T1 is about 25° C. to about 30° C.), the surface 115 has a slight convex curvature as shown in FIGS. 1A and 1C.

As the temperature of the component 110 increases toward a greater temperature and approaches a maximum rated temperature T2 for the component (e.g., T2 can be 100° C. or greater, such as about 180° C. to about 190° C. or even greater depending upon a particular configuration), the surface 115 of the component 110 exhibits a slight warpage within the convex surface area, where the slight warpage is concave and depicts a "smile" along the surface 115 (as shown in FIGS. 1A and 1B). Thus, the contour of a portion of the surface of the component 110 undergoes a shape inversion (e.g., convex to concave) caused by the change (increase) in temperature.

As shown in FIG. 1C, a conventional heat sink component 130 includes a base or cold plate that engages the surface 115 of the component 110 to effect heat transfer between the components so as to cool the component during operations. At the lower temperature T1, there is a slight gap that may exist between the slightly non-planar surface area portion of the heat sink facing surface 115 and a lower or component engaging surface of the heat sink 130. As further shown in FIG. 1C, a filler material 120, such as grease or a phase change material (PCM) or a thermal pad), can be applied between the heat sink component 130 and the circuit component 110. However, such filler material 120 is not as effective at facilitating heat transfer between the heat sink and the circuit component resulting in less effective cooling of the circuit component at the greater temperature T2. In addition, the gap between heat sink component and circuit component becomes even larger (at the concave portion or "smile" of surface 115) at the greater temperature T2.

Figure 2A:
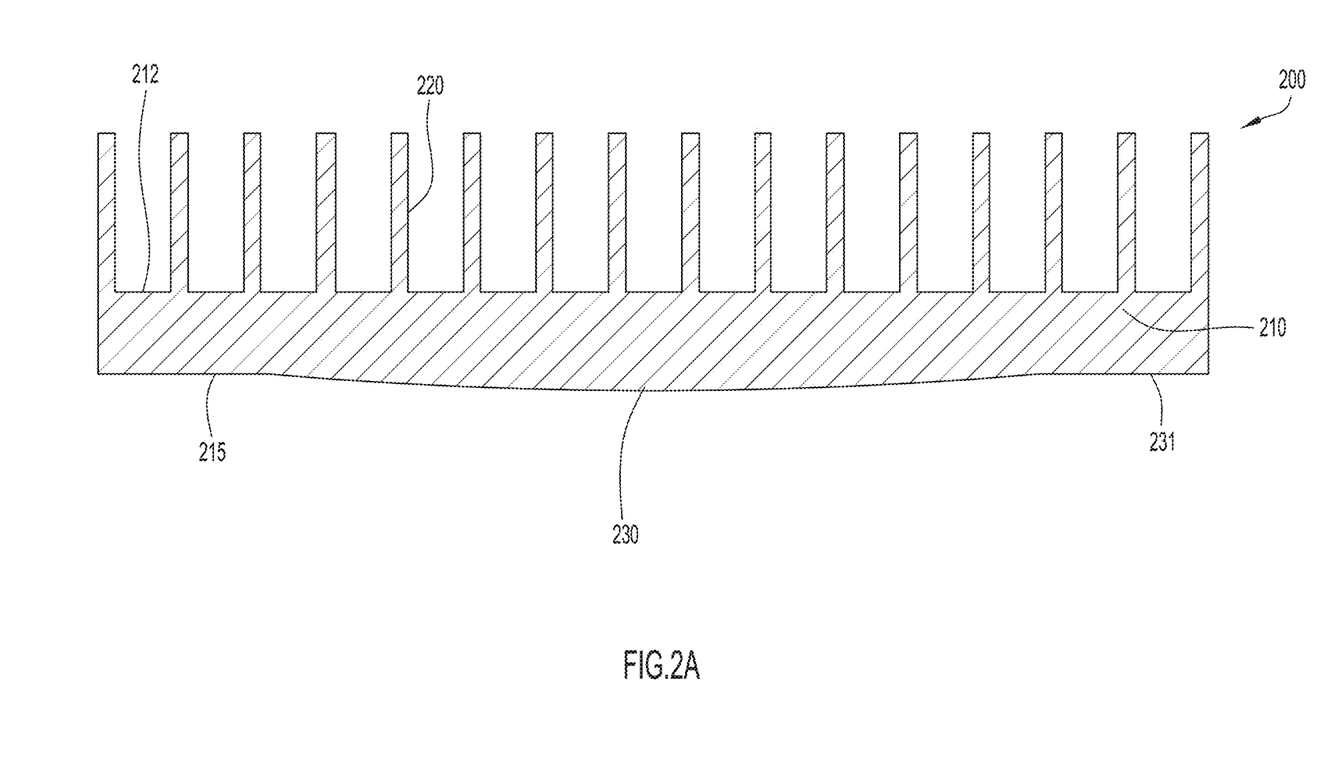
FIG. 2A depicts a side view in cross-section of a heat sink component of an example embodiment as described herein including an adaptive curvature at its circuit component engaging surface.
Figure 2B:
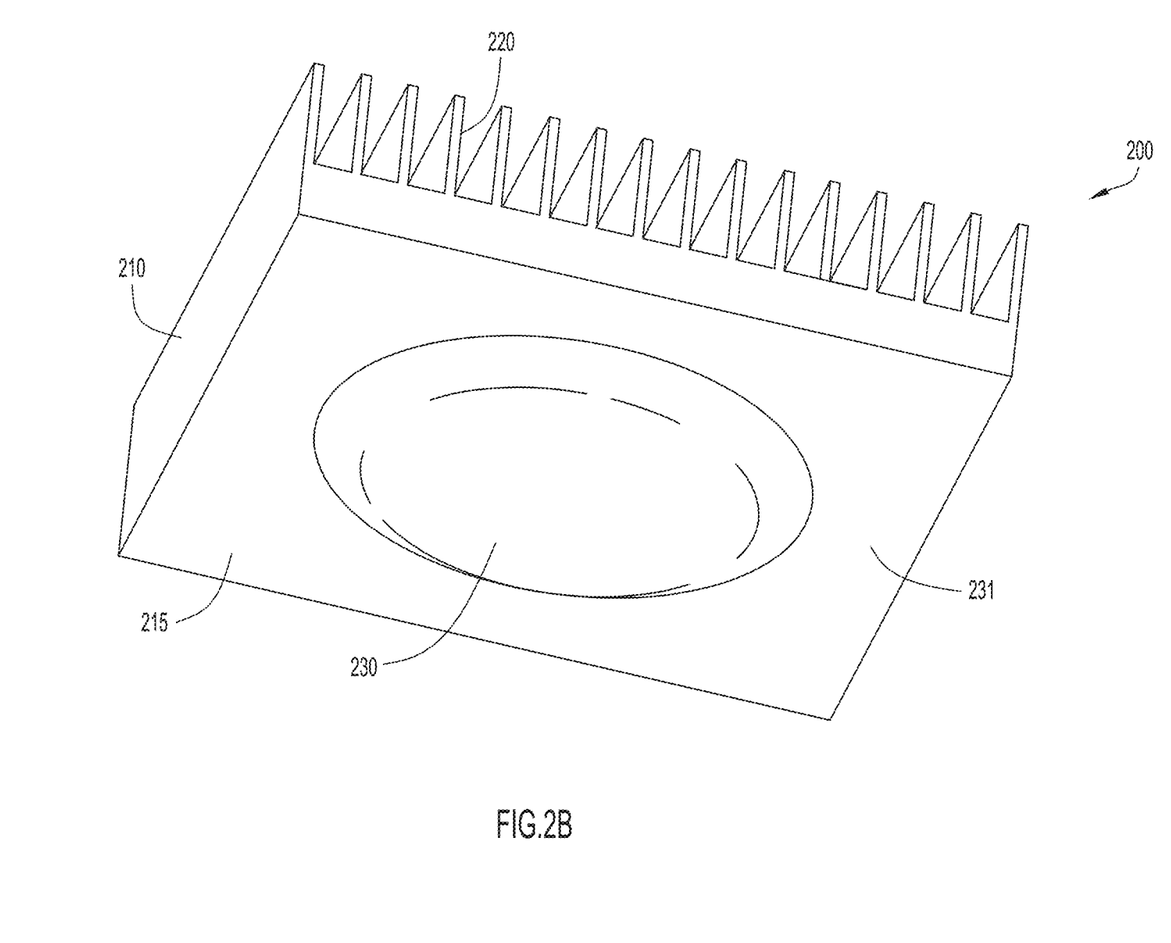
FIG. 2B depicts an under side view in perspective of the heat sink component of FIG. 2A.

Referring to FIGS. 2A and 2B, a heat sink component 200 is provided to account for the anticipated high temperature/thermal warpage that occurs along the surface 115 of the circuit component 110. The heat sink component 200 includes a base plate or cold plate 210 and a plurality of thin cooling fins 220 extending transversely from an outward surface 212 of the cold plate 210. The cold plate, fins and any other components of the heat sink component are constructed of suitable materials (e.g., copper, aluminum, etc.) that facilitate effective heat transfer at a suitable rate between the circuit component and the heat sink component.

Figure 3:
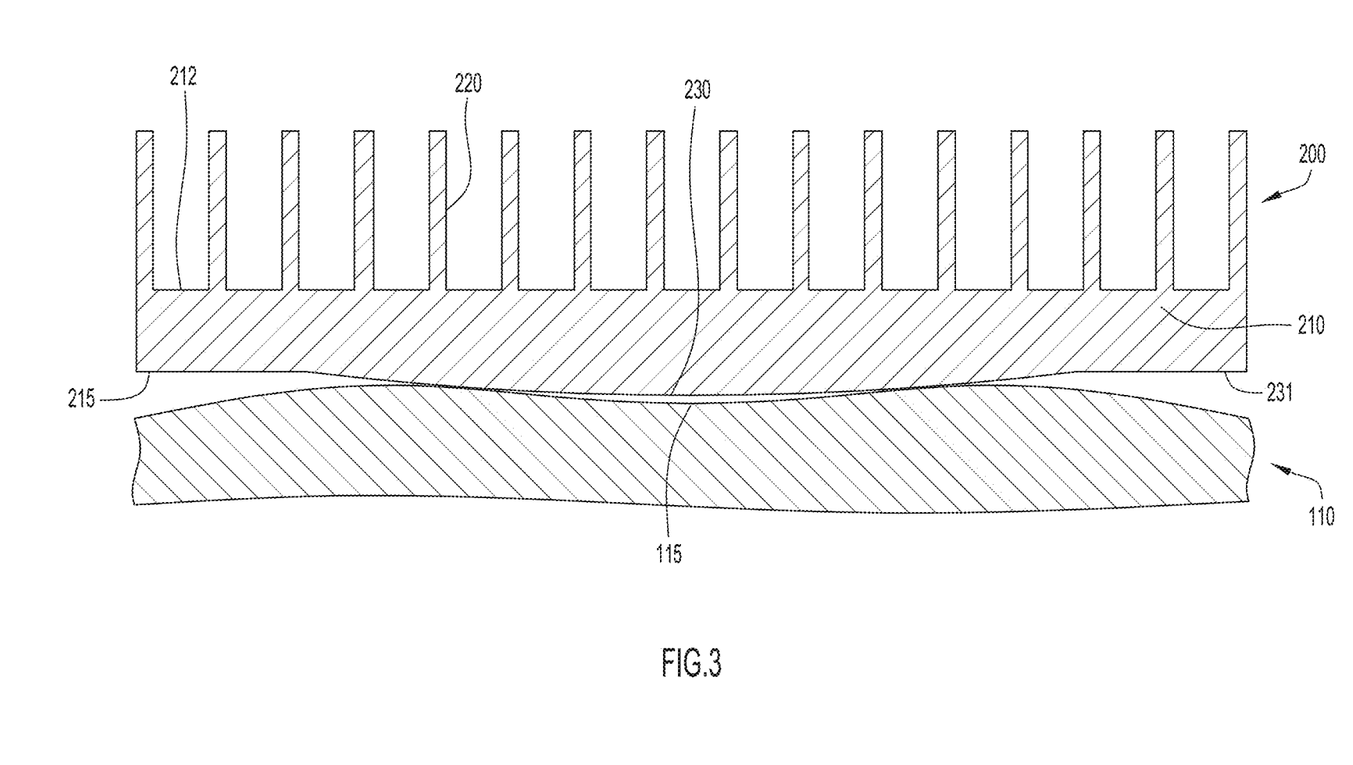
FIG. 3 depicts a side view in cross-section of the circuit component of FIG. 1A including the heat sink component of FIG. 2A coupled with the circuit component.

An opposing, circuit component engaging surface 215 of the cold plate 210 includes a slightly curved and convex surface area portion 230 surrounded by a generally planar portion 231 and that is aligned on the surface 215 so as to correspond and engage with the inverted concave surface portion along surface 115 that occurs due to thermal warpage at higher temperatures of the component 110. As shown in FIG. 3, the heat sink component 200 is coupled or connected with the circuit component 110 such that the lower or component engaging surface 215 of the heat sink component 200 engages with the top or heat sink component engaging surface 115, where the surface area portion 230 with adaptive convex curvature conforms precisely with the concave warpage at the surface 115 of the component 110 at the upper operating temperature T2. The precise conformity of the surface 215 of the cold plate 210 with the surface 115 of the circuit component 110 facilitates maximum surface area contact between the heat sink component and the circuit component when heat transfer/cooling is most desired (i.e., at the upper operating temperatures).

In certain example embodiments, the cold plate of the heat sink component can comprise a solid block material. In such embodiments, the contouring of the circuit component engaging surface can be machined to provide a contour adapted to correspond with the warped contour of the circuit component to be cooled, where the contour is determined as noted herein. The circuit component engaging surface of the solid cold plate can be precisely contoured using any suitable machining process, e.g., computerized numeric control (CNC) machining techniques that provide extremely precise contouring of a surface within very low tolerance levels. For example, a 5-axis CNC machining device can be used to create a very precise curvature along the circuit component engaging surface of the solid cold plate (e.g., within tolerance levels within 0.125 mm, or even as low as 0.025 mm).

Figure 4A:
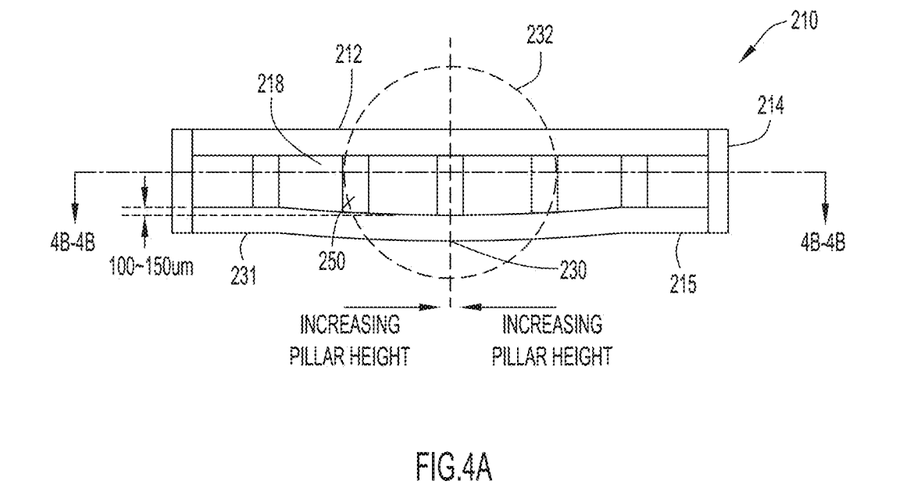
FIG. 4A depicts a side view in cross-section of an example embodiment of a vapor chamber cold plate for a heat sink component including pillars disposed within the cold plate that provide an adaptive curvature to the circuit component engaging surface of the cold plate.
Figure 4B:
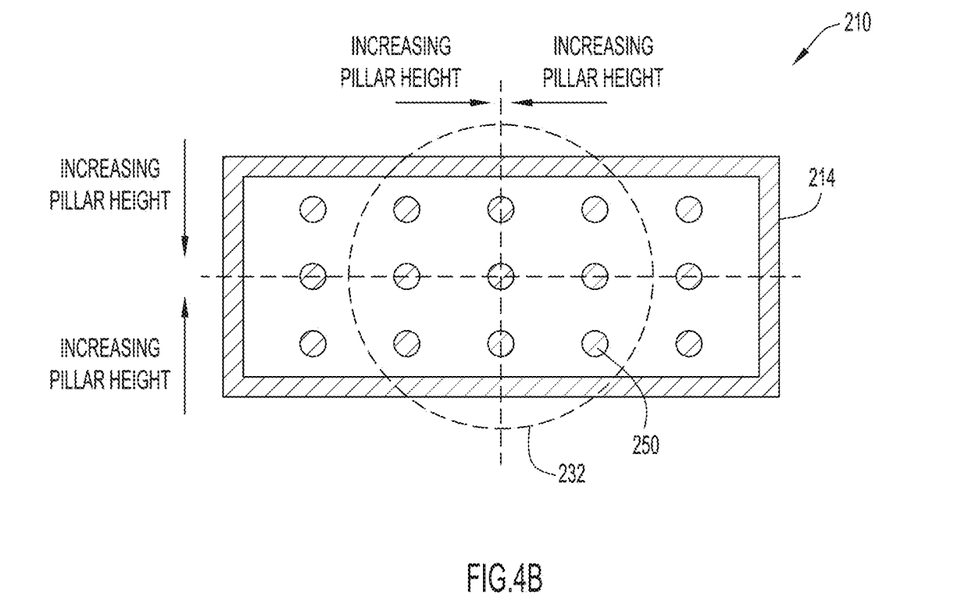
FIG. 4B depicts a top view in plan cross-section of the vapor chamber cold plate taken from the view of FIG. 4A along lines 4B-4B.

In other example embodiments, the cold plate comprises a hollow member including an enclosed chamber (e.g., vapor chamber) to enhance thermal properties of the heat sink. Referring to FIGS. 4A and 4B, an embodiment of a cold plate 210 for the heat sink component is hollow and includes an upper wall including the top surface 212 from which cooling fins 220 extend, a lower wall including the circuit component engaging surface 215 that is separated from the top wall, and side walls 214 that extend between and connect the upper and lower walls to define an enclosure or vapor chamber 218 within the cold plate 210. A plurality of pillars 250 formed of a suitably rigid material also with suitable heat transfer properties (e.g., copper pillars) are provided within the vapor chamber 218 and also extend between the upper and lower walls including surfaces 212, 215.

The pillars 250 can be provided in any suitable configuration or arrangement within the vapor chamber 218, such as in a series of rows and columns as shown in the plan view of FIG. 4B. The pillars within a region 232 of the surface 215 can vary in length, with pillars 250 arranged closer to a center of the region 232 having a greater length in comparison to pillars 250 disposed closer to an outer periphery of the region 232. Specifically, the pillars 250 within the region 232 increase in length or pillar height in a direction that extends from the outer periphery of the region 232 toward a center of the region 232. The variance in pillar heights within the region 232 results in a bowing of the circuit component engaging surface 215 in relation to the upper or top surface 212, which results in the formation of the convex surface area portion 230 at the surface 215 that corresponds with the region 232. For example, as depicted in FIG. 4A, the pillars can increase in length or height an amount of about 100 to 150 micrometers at the maximum lengths (i.e., closest to the center of region 232). In addition, surfaces forming the cold plate 210 can be constructed such that the lower or circuit component engaging surface 215 has a flexibility that is slightly greater in relation to the top surface 212 such that the increasing pillar heights cause the surface 215 to bow while surface 212 remains relatively planar. The lengths of the pillars 250 can be precisely controlled (e.g., by forming copper pillars in a build-up process within the vapor chamber) so as to define with high precision the convex curvature of the convex surface area portion 230 along the surface 215. The pillars are also sufficiently strong to withstand compressive forces when the cold plate 210 is engaged with the circuit component 110 at a lower temperature T1 in which there is no significant heat induced warpage of the circuit component surface 115.

Figure 5:
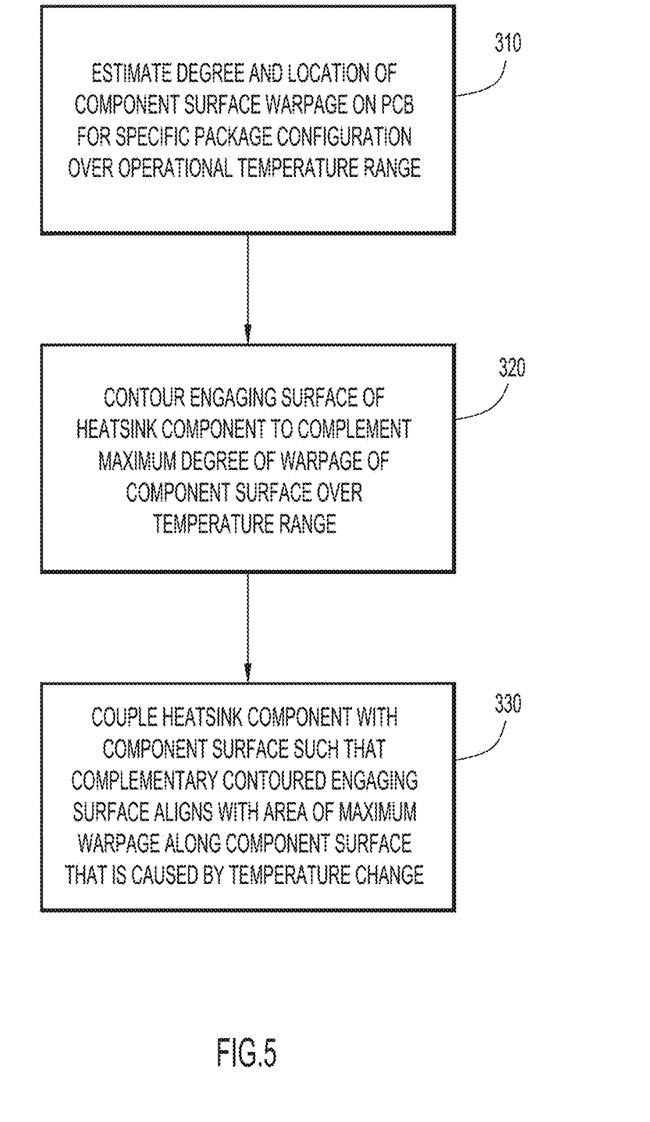
FIG. 5 is a flowchart depicting an example method as described herein for obtaining an adaptive curvature for a heat sink component based upon analysis and identification of a precise change in surface warpage of a circuit component based upon a specific circuit board configuration.
Figure 6:
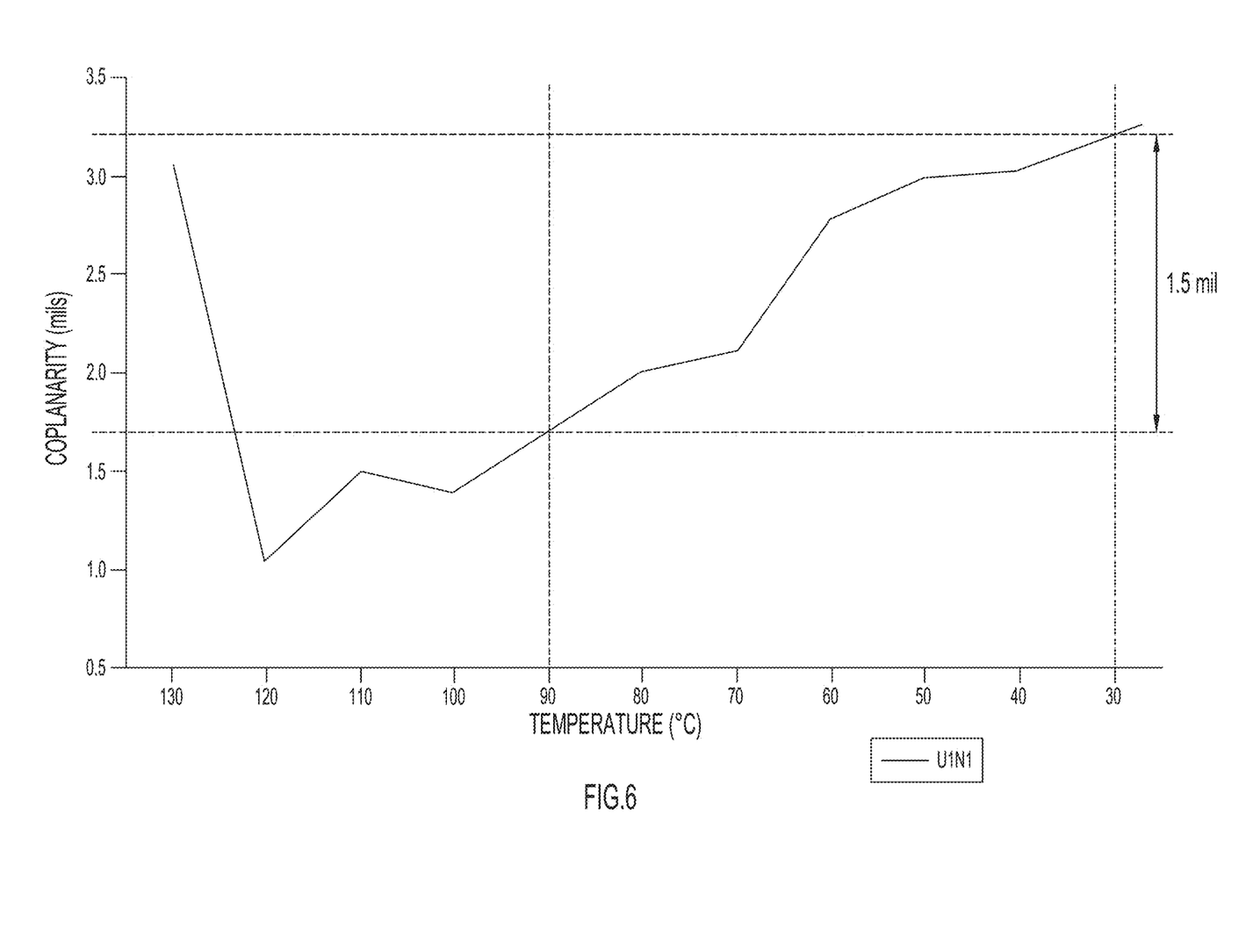
FIG. 6 is a plot of change in coplanarity (warpage) of a circuit component for a specific circuit board configuration that is measured over a temperature range of operation.

An example method of forming a precise curvature for the circuit component engaging surface of the heat sink component is now described with reference to FIGS. 5, 6 and 7. Referring to the flowchart in FIG. 5, the surface warpage of a circuit component that occurs over an operational temperature range, e.g., from T1 to T2, within a specific environment and/or device configuration is estimated at 310. In particular, the circuit component 110 can comprise an ASIC configured for assembly and integration with a printed circuit board (PCB) in a specific arrangement with other circuit components for a specific device, such as a device 400 depicted in FIG. 8. The operational temperature range for the ASIC circuit component 110 is based upon the specification requirements of the PCB and operational requirements of the device. Since the precise warpage and shape inversion (e.g., convex to concave shape) imparted to the surface of the ASIC over a specified temperature range (from T1 to T2) will be based upon its implementation in a specific environment (e.g., a function of circuit package type, operational temperature range, ASIC to PCB interactions, etc.), tests can be conducted by mounting the ASIC circuit component to the PCB and performing operations over the temperature range T1 to T2. During this testing, the surface warpage of the circuit component can be monitored and measured to determine a precise location, size and degree of warpage within the operational temperature range.

In an example embodiment, a Shadow Moiré technique is used to precisely measure the change or displacement of the surface contour of the circuit component on the PCB over the operational temperature range T1-T2. Any other suitable technique (e.g., laser scanning over the surface) can also be used to measure how the component surface contour changes (e.g., inversion of a portion of the convex surface to become concave or "smile") with change in operating temperature. An example set of test data is depicted in FIG. 6 showing a change in coplanarity (indicating occurrence of warpage) at a particular point or location along the surface of the circuit component over a temperature range of T1=30° C. and T2=120° C. (e.g., in the embodiment of FIG. 6, the coplanarity value changes be about 1.5 mil over this temperature range at this precise location along the surface). Similar measurements can be obtained at a variety of locations along the circuit component surface to provide a precise measurement of how the surface contour changes for the circuit component in the application specific environment and over the operational temperature range of T1 to T2. Thus, a precise indication of surface warpage for the circuit component in the specific environment in which it is used can be obtained.

At 320, the circuit component engaging surface 215 of the cold plate 210 for the heat sink component 200 is contoured to form the convex surface area portion 230 utilizing the data obtained from the testing conducted at 310. Having specific data with regard to the precise contouring changes/warpage that occur at precise locations along the circuit component surface and, in particular, the maximum contour change/warpage that occurs (e.g., at the upper or limit temperature T2) facilitates contouring of the surface 215 of the cold plate 210 in a complementary (i.e., inverse) manner. Contouring of the surface 215 of the cold plate 210 to form the convex surface area portion 230 can be achieved in a manner as previously described herein.

The convex surface area portion 230 can also be formed along the surface 215 of the cold plate 210 so as to avoid any sharp or detrimental apex or peak that might otherwise cause a point load and/or potential damage to the circuit component during use.

Figure 7:
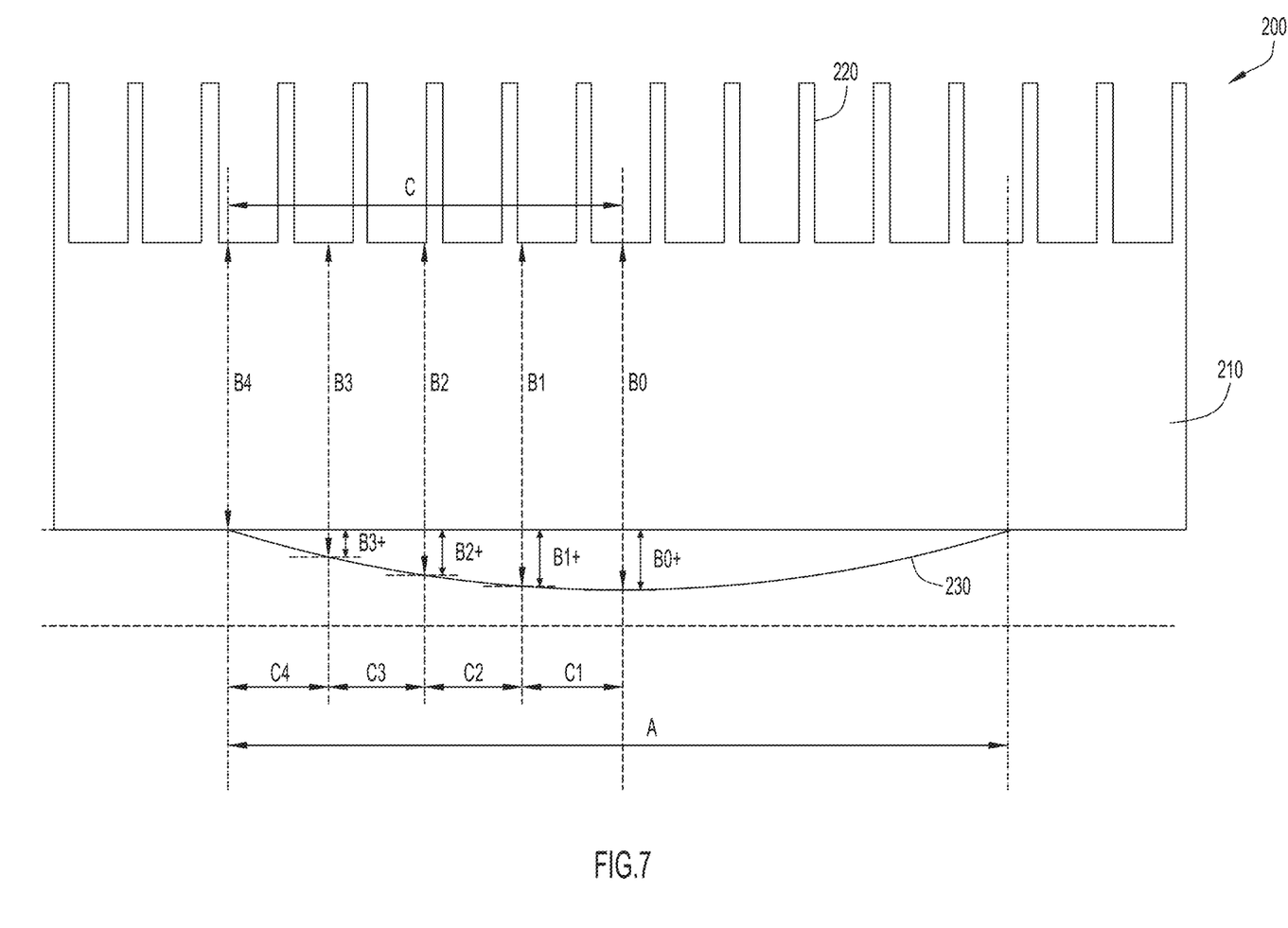
FIG. 7 schematically depicts how the adaptive curvature of the heat sink component at its engaging surface is defined based upon the method described in FIG. 5.

Referring to FIG. 7, an example embodiment is depicted showing how the surface contour of the convex surface area portion 230 is defined in segments. The dimension A represents the size, length or diameter of the area defining the convex surface area portion 230, and dimension C represents half this length (C=A/2). The lengths B1, B2, B3 and B4 that extend transverse dimension C define the thickness of the cold plate 210 at their locations and are arranged sequentially from the center of portion 230 outward to its peripheral edge. As shown in FIG. 7, the cold plate thickness dimension of B1>B2>B3>B4, where B4 is at the peripheral edge and represents the general flatness or planarity and constant thickness dimension of the cold plate outside of the convex surface area portion 230. The region of portion 230 defined by dimension C includes curved segments located between B0 and B1 (represented as segment C1), between B1 and B2 (represented as segment C2), between B2 and B3 (represented as segment C3), and between B3 and B4 (represented as segment C4). In addition, each of segments $B1^+$, $B2^+$ and $B3^+$ represents a curved section of portion 230 that extends from the planar dimension (B4) to a respective B1, B2 or B3 dimension at the respective C1, C2, and C3 segments. It is noted that the curvature is symmetrical along either side of the center of dimension A, such that the designations along dimension C, or one half of the curvature, are also applicable along the other half of the curvature.

Thus, each designation shown in FIG. 7 can be defined as follows:
A: size (e.g., length, diameter, etc.) of convex surface area portion that aligns with warped surface portion of circuit component.
C: A/2
C1, C2, C3, C4: equal sized segments, each being C/4 in width.
B0, B1, B2, B3, B4: total height/thickness of cold plate including curvature height at such point (B4 is normal/planar thickness of cold plate).

The curvature along the surface of the cold plate that is adapted to match the warpage of the circuit component can be defined as follows:

$B0^+$, $B1^+$, $B2^+$, $B3^+$: curvature height from planar at each point.

$B0^+$: highest curvature height, which is estimated based on Shadow Moire' data (as measured in step 310).

X: value that is dependent on warpage change of the circuit component in specific environment (as measured in step 310).

$B0=B4+B0^+$
$B1=B0=B4+B0^+$
$B2=B1-X$
$B3=B2-X$
$B4=B3-X$

By setting B1=B0 (the highest or greatest curvature point), this results in a flattening of the convex curvature at its greatest height which avoids the formation of a small or sharp apex. This in effect diminishes or prevents a point load from otherwise being applied to the circuit component during use. In other words, the maximum thickness of the heat plate (i.e., B0, B1), as well as the maximum curvature height (i.e., $B0^+$, $B1^+$) of the convex surface area portion 230 forms a relatively flat plateau or defined length (2C1) instead of being a single apex or point. The flat plateau defines a length in which a thickness of the cold plate (i.e., from upper surface 212 to lower surface 215) is at its maximum and is constant. This defined length, which can be at least 10% (i.e., a minimum of 10%) of the lengthwise or longest dimension of the non-planar (i.e., convex) surface portion (e.g., about 25% of the length A as depicted in FIG. 7) is further sufficient to prevent a point load being applied to the circuit component.

At 330, the heat sink component 200 is coupled with the circuit component 110 so that the convex surface area portion 230 of the surface 215 aligns with the area of maximum inverted and concave warpage that is predicted or determined to occur along the surface 115 of the circuit component 110 within the temperature range T1-T2.

Figure 8:
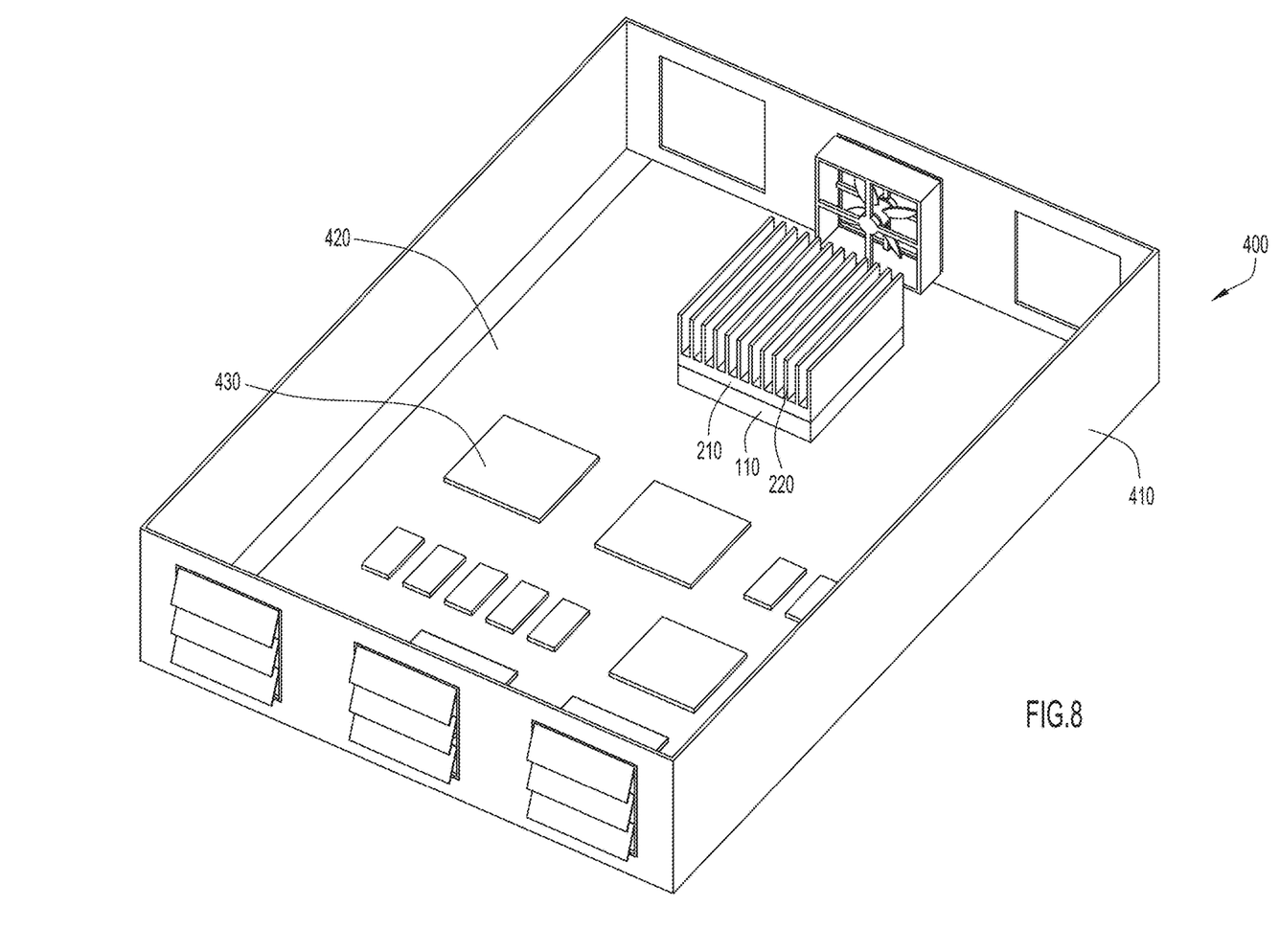
FIG. 8 depicts a view in perspective of an electronic device (with a top lid of the housing removed) showing circuit components including a heat sink component configuration such as is shown in FIG. 3.

An example embodiment of an electronic device (e.g., a networking device) that implements the heat sink component system as described herein is depicted in FIG. 8. The device 400 includes a housing 410 that encloses a PCB 420 and various electronic components 430 coupled and/or integrated with the PCB 420 (e.g., integrated circuit components). Circuit component 110 is coupled with the PCB 420 and comprises an ASIC die package. Heat sink component 200, including cold plate 210 and fins 220, is applied directly to the top surface (e.g., die package lid or top surface of ASIC) of the circuit component 110.

During operations of the device 400 (e.g., high speed data transfer operations), the circuit component heats up from a temperature T1 to an elevated temperature T2, causing warpage to occur at the top surface of the circuit component. The curvature of the heat sink component (implemented as the convex surface area portion 230 at the circuit component engaging surface 215) is adapted to match the inverted concave surface warpage of the circuit component thus ensuring adequate surface area contact and heat transfer between the heat sink component and the circuit component. Thus, adequate cooling of the circuit component is maintained at elevated temperatures causing maximum degree of warpage of the circuit component surface. This in turn minimizes or prevents a thermal runaway event associated with the circuit component during operations of the device.

While embodiments of a heat sink component have been described herein to address thermal warpage of the circuit component resulting in an inverted and concave contouring along its surface, other embodiments of a heat sink component utilizing the concepts described herein can also be provided to complement any other types of contour changes that may occur due to thermal effects on the circuit component. For example, a heat sink can be provided utilizing the concepts as described herein to account for thermal warpage along a surface of a circuit component that includes anyone or combination of contour changes when the circuit component is elevated in temperature over a specific operating temperature range, including changes from planar to concave and/or convex, as well as concave to convex, or any combinations of convex and concave contour changes. Thus, the heat sink component can be provided with a circuit component engaging surface in which a non-planar surface portion is surrounded by a generally planar surface portion, where the non-planar surface portion has a contour that complements in an inverted manner a surface portion of a circuit component that changes in contour (becomes thermally warped) as a result of an increase in temperature of the circuit component.

Thus, in example embodiments, a heat sink component comprises a cold plate including a first surface configured to engage a circuit component and a second surface opposing the first surface, and a plurality of fins extending transversely from the second surface of the cold plate. The first surface includes a non-planar surface portion and a planar surface portion surrounding the non-planar surface portion. The non-planar surface portion can comprise a convex surface area portion.

The cold plate can comprise a solid block. Alternatively, the cold plate can include a hollow interior and a plurality of pillars extending within the hollow interior between the first surface and the second surface. The pillars can be disposed at a region corresponding with the non-planar surface portion have varying lengths that bow the first surface to define a curvature of the non-planar surface portion.

In another embodiment, an apparatus comprises a printed circuit board (PCB), a circuit component coupled with the PCB, and a heat sink component coupled with the circuit component. The heat sink component can comprise a cold plate including a first surface configured to engage a surface of the circuit component and a second surface opposing the first surface, and a plurality of fins extending transversely from the second surface of the cold plate, where the first surface includes a non-planar surface portion and a planar surface portion surrounding the non-planar surface portion.

The surface of the circuit component can change in contour with a change from a temperature T1 to a temperature T2 that is greater than temperature T1, and the non-planar surface portion at the first surface of the cold plate can have a contour that corresponds so as to engage with a surface contour of the surface of the circuit component at the temperature T2.

The surface contour of the surface of the circuit component at the temperature T2 can be concave, and the contour of the non-planar surface portion at the first surface of the cold plate can be convex.

The cold plate can comprise a solid block. Alternatively, the cold plate can include a hollow interior and a plurality of pillars extending within the hollow interior between the first surface and the second surface. The pillars can be disposed at a region corresponding with the non-planar surface portion have varying lengths that bow the first surface to define the contour of the non-planar surface portion at the first surface of the cold plate.

The apparatus can comprise a networking device.

In a further embodiment, a method comprises providing a cold plate for a heat sink including a first surface configured to engage a circuit component and a second surface opposing the first surface, contouring the first surface to include a non-planar surface portion and a planar surface portion surrounding the non-planar surface portion, and providing a plurality of fins extending transversely from the second surface of the cold plate.

The method can further comprise determining a change in curvature of a surface of the circuit component coupled with a printed circuit board (PCB) that is caused by thermal warpage over a temperature range from temperature T1 to temperature T2, where temperature T2 is greater than temperature T1. The contouring the first surface of the cold plate can include contouring the non-planar surface portion so as to correspond and engage with a surface contour of the surface of the circuit component at the temperature T2.

The surface contour of the surface of the circuit component at the temperature T2 can be concave, and the contouring the non-planar surface portion at the first surface of the cold plate can comprise forming a convex contour for the non-planar surface portion.

The forming the convex contour for the non-planar surface portion at the first surface of the cold plate can comprise providing a plateau defined as a maximum and constant thickness of the cold plate at the non-planar surface portion, where the plateau has a length that is at least 10% of a lengthwise dimension of the non-planar surface portion.

The method can further comprise coupling the heat sink with the circuit component.

The cold plate can comprise a solid block, and the contouring the first surface to include the non-planar surface portion can comprise machining the first surface to form the non-planar surface portion.

The cold plate can include a hollow interior, and the contouring the first surface to include the non-planar surface portion can comprise providing plurality of pillars extending within the hollow interior between the first surface and the second surface. The pillars can be disposed at a region corresponding with the non-planar surface portion and have varying lengths that bow the first surface to define the convex contour of the non-planar surface portion.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A heat sink component comprising:
a cold plate including a first surface configured to engage a circuit component and a second surface opposing the first surface; and
a plurality of fins extending transversely from the second surface of the cold plate;
wherein:
the first surface includes a non-planar surface portion and a planar surface portion surrounding the non-planar surface portion; and
the cold plate includes a hollow interior and a plurality of pillars extending within the hollow interior between the first surface and the second surface, the plurality of pillars being disposed at a region corresponding with the non-planar surface portion and have varying lengths that bow the first surface to define a curvature of the non-planar surface portion.

2. The heat sink component of claim 1, wherein the non-planar surface portion comprises a convex surface area portion.

3. The heat sink component of claim 2, wherein the convex surface area portion defines a flat plateau having a defined length in which a thickness of the cold plate is constant along the flat plateau, and the thickness of the cold plate is defined as a distance between the first surface and the second surface.

4. The heat sink component of claim 3, wherein the defined length of the flat plateau is at least 10% of a lengthwise dimension of the convex surface area portion.

5. The heat sink component of claim 1, wherein each of the plurality of pillars comprises copper.

6. An apparatus comprising:
a printed circuit board (PCB);
a circuit component coupled with the PCB; and
a heat sink component coupled with the circuit component, the heat sink component comprising:
a cold plate including a first surface configured to engage a surface of the circuit component and a second surface opposing the first surface, wherein the cold plate includes a hollow interior and a plurality of pillars extending within the hollow interior between the first surface and the second surface; and
a plurality of fins extending transversely from the second surface of the cold plate;
wherein:
the first surface includes a non-planar surface portion and a planar surface portion surrounding the non-planar surface portion; and
the heat sink component is coupled with the circuit component such that the first surface of the cold plate conforms to the surface of the circuit component to facilitate maximum surface area contact between the heat sink component and the circuit component at a desired temperature.

7. The apparatus of claim 6, wherein the surface of the circuit component changes in contour with a change in temperature of the circuit component from a temperature T1 to a temperature T2 that is greater than temperature T1, and the non-planar surface portion at the first surface of the cold plate has a contour that corresponds so as to engage with a surface contour of the surface of the circuit component at the temperature T2.

8. The apparatus of claim 7, wherein the surface contour of the surface of the circuit component at the temperature T2 is concave, and the contour of the non-planar surface portion at the first surface of the cold plate is convex.

9. The apparatus of claim 8, wherein the cold plate comprises a solid block.

10. The apparatus of claim 6, wherein the plurality of pillars are disposed at a region corresponding with the non-planar surface portion have varying lengths that bow the first surface to define a contour of the non-planar surface portion at the first surface of the cold plate.

11. The apparatus of claim 6, wherein the apparatus comprises a networking device.

12. The apparatus of claim 6, wherein the non-planar surface portion of the first surface is a convex surface area portion, the convex surface area portion defines a flat plateau having a defined length in which a thickness of the cold plate is constant along the flat plateau, and the thickness of the cold plate is defined as a distance between the first surface and the second surface.

13. The apparatus of claim 12, wherein the defined length of the flat plateau is at least 10% of a lengthwise dimension of the convex surface area portion.

14. The apparatus of claim 6, wherein each of the plurality of pillars comprises copper.

15. The apparatus of claim 6, wherein the circuit component comprises an ASIC die package.

16. The apparatus of claim 6, wherein the desired temperature is within an operational temperature range determined based on a plurality of specification requirements of the PCB.

17. An apparatus comprising:
a printed circuit board (PCB);
a circuit component coupled with the PCB; and
a heat sink component coupled with the circuit component, the heat sink component comprising:
a cold plate including a first surface configured to engage a surface of the circuit component and a second surface opposing the first surface; and
a plurality of fins extending transversely from the second surface of the cold plate;

wherein:
the first surface includes a non-planar surface portion and a planar surface portion surrounding the non-planar surface portion; and
the cold plate includes a hollow interior and a plurality of pillars extending within the hollow interior between the first surface and the second surface, the plurality of pillars being disposed at a region corresponding with the non-planar surface portion and have varying lengths that bow the first surface to define a curvature of the non-planar surface portion at the first surface of the cold plate.

18. The apparatus of claim 17, wherein the non-planar surface portion comprises a convex surface area portion.

19. The apparatus of claim 17, wherein the surface of the circuit component changes in contour with a change in temperature of the circuit component from a temperature T1 to a temperature T2 that is greater than temperature T1, and the non-planar surface portion at the first surface of the cold plate has a contour that corresponds so as to engage with a surface contour of the surface of the circuit component at the temperature T2.

20. The apparatus of claim 19, wherein the surface contour of the surface of the circuit component at the temperature T2 is concave, and the contour of the non-planar surface portion at the first surface of the cold plate is convex.

* * * * *